(12) United States Patent
Huang (10) Patent No.: US 11,547,006 B2
(45) Date of Patent: Jan. 3, 2023

(54) ASSEMBLY STRUCTURE

(71) Applicants: Inventec (Pudong) Technology Corporation, Shanghai (CN); INVENTEC CORPORATION, Taipei (TW)

(72) Inventor: Pin-Sheng Huang, Taipei (TW)

(73) Assignees: Inventec (Pudong) Technology Corporation, Shanghai (CN); INVENTEC CORPORATION, Taipei (TW)

(*) Notice: Subject to any disclaimer, the term of this patent is extended or adjusted under 35 U.S.C. 154(b) by 143 days.

(21) Appl. No.: 17/109,091

(22) Filed: Dec. 1, 2020

(65) Prior Publication Data
US 2022/0078930 A1 Mar. 10, 2022

(30) Foreign Application Priority Data
Sep. 4, 2020 (CN) .......................... 202010921776.2

(51) Int. Cl.
*H05K 5/02* (2006.01)
*G06F 1/18* (2006.01)

(52) U.S. Cl.
CPC .......... *H05K 5/0217* (2013.01); *G06F 1/182* (2013.01)

(58) Field of Classification Search
CPC ........................... H05K 5/0247; H05K 7/1487
See application file for complete search history.

(56) References Cited

U.S. PATENT DOCUMENTS

| | | | | | |
|---|---|---|---|---|---|
| 4,419,722 | A | * | 12/1983 | Bury | F21V 19/002 362/396 |
| 5,302,778 | A | * | 4/1994 | Maurinus | H01L 33/58 257/E31.127 |
| 5,574,521 | A | * | 11/1996 | Constable | G03B 17/24 396/315 |
| 6,341,987 | B1 | * | 1/2002 | Chih | H01R 12/592 439/456 |
| 6,409,530 | B1 | * | 6/2002 | Zhao | H01R 13/6641 439/490 |
| 6,411,022 | B1 | * | 6/2002 | Machida | H01R 33/09 313/318.1 |
| 6,688,908 | B2 | * | 2/2004 | Wallace | H01R 24/50 439/490 |
| 7,568,956 | B1 | * | 8/2009 | Tseng | H01R 33/06 439/619 |
| 10,001,606 | B1 | * | 6/2018 | Hsieh | G02B 6/4292 |
| 2004/0139606 | A1 | * | 7/2004 | Inada | H01R 43/20 29/748 |

(Continued)

*Primary Examiner* — Hung S. Bui
*Assistant Examiner* — Sagar Shrestha
(74) *Attorney, Agent, or Firm* — CKC & Partners Co., LLC (57) ABSTRACT

An assembling structure includes a working element, a housing and a limiting member. The working element includes first and second pins. The housing includes an opening. The working element is located in the opening. The first and second pins of the working element extend toward an interior of the housing. The limiting member is connected to the housing. The limiting member includes a supporting plate and a convex member. The convex member includes a first abutting portion and a second abutting portion. The first pin and the second pin respectively abut against the first abutting portion and the second abutting portion.

8 Claims, 6 Drawing Sheets

(56) References Cited

U.S. PATENT DOCUMENTS

| | | | |
|---|---|---|---|
| 2009/0130889 A1* | 5/2009 | Daily | F21V 21/002 |
| | | | 439/345 |
| 2010/0254161 A1* | 10/2010 | Liu | F21V 19/0005 |
| | | | 362/654 |
| 2010/0314655 A1* | 12/2010 | Thompson | H05K 1/189 |
| | | | 257/E33.066 |
| 2011/0013404 A1* | 1/2011 | Ueno | H01R 13/641 |
| | | | 362/362 |
| 2014/0355277 A1* | 12/2014 | Lin | H01R 33/09 |
| | | | 362/391 |
| 2015/0351270 A1* | 12/2015 | Takasaki | H02G 5/08 |
| | | | 174/541 |
| 2018/0376551 A1* | 12/2018 | Wang | H05B 47/16 |
| 2021/0006005 A1* | 1/2021 | Yamanaka | H01R 13/521 |
| 2021/0364687 A1* | 11/2021 | Wang | G02B 6/4262 |

* cited by examiner

ASSEMBLY STRUCTURE

RELATED APPLICATIONS

This application claims priority to China Application Serial Number 202010921776.2, filed Sep. 4, 2020, which is herein incorporated by reference in its entirety.

BACKGROUND

Field of Invention

The present disclosure relates to an assembly structure.

Description of Related Art

In a conventional shaft-hole assembly, the housing, the holder and the working element to be fixed lack a positioning limitation in a rotational direction. The working element may be a light-emitting diode. If, after assembly, the angle of the light-emitting diode is different from a predetermined assembly angle, the brightness appearance would not be uniform.

Therefore, those in the industry are endeavoring to provide a solution for the above-mentioned problem.

SUMMARY

An aspect of the present disclosure relates to an assembly structure.

According to one embodiment of the present disclosure, an assembling structure includes a working element, a housing and a limiting member. The working element includes first and second pins. The housing includes an opening. The working element is located in the opening. The first and second pins of the working element extend toward an interior of the housing. The limiting member is connected to the housing. The limiting member includes a supporting plate and a convex member. The convex member includes a first abutting portion and a second abutting portion. The first pin and the second pin of the pins respectively abut against the first abutting portion and the second abutting portion.

In one or more embodiments of the present disclosure, the working element includes a light-emitting diode element. The light-emitting diode element includes a light-emitting portion. The light-emitting portion is exposed from the housing. The first and second pins are configured to extend from a bottom of the light-emitting portion toward the interior of the housing.

In one or more embodiments of the present disclosure, the first pin and the second pin are covered by a first cable and a second cable, respectively. The first pin and the second pin abut against the first abutting portion and the second abutting portion through the first cable and the second cable, respectively.

In one or more embodiments of the present disclosure, the assembly structure further includes a positioning holder. The positioning holder includes a fixing groove body. The working element is fixed in the fixing groove body. The positioning holder is located in the first opening of the housing, so that the working element is fixed in the first opening.

In some embodiments of the present disclosure, the first opening is formed in a first side wall of the housing. The positioning holder includes a first engaging member. The first engaging member protrudes from the fixing groove body and extends parallel to the first side wall.

In some embodiments of the present disclosure, the positioning holder further includes a second engaging member opposite to the first engaging member. The second engaging member protrudes from the fixing groove body and extends parallel to the first side wall. A first direction in which the first engaging member is opposite to the second engaging member is perpendicular to a second direction in which the convex member of the limiting member extends.

In one or more embodiments of the present disclosure, the convex member is perpendicular to the supporting plate. The first abutting portion and the second abutting portion of the convex member form a T-shape.

In one or more embodiments of the present disclosure, the first opening is formed in a first side wall of the housing. The limiting member is located at a second opening of a second side wall of the housing. The first side wall is perpendicular to the second side wall.

In some embodiments of the present disclosure, the limiting member further includes an abutting member protruding from the supporting plate. The abutting member extends to the second opening to abut against the second side wall.

In some embodiments of the present disclosure, the abutting member and the convex member are parallel to each other. The abutting member is perpendicular to the second side wall.

In summary, by providing a limiting portion in the housing, the pins of the working element to be fixed are limited, thereby limiting the rotation of the working element. Therefore, when the working element is a light-emitting diode element, the problem of light appearance difference caused by rotation can be improved.

It is to be understood that both the foregoing general description and the following detailed description are by examples, and are intended to provide further explanation of the invention as claimed.

BRIEF DESCRIPTION OF THE DRAWINGS

In order to make the above and other objects, features, advantages, and embodiments of the present disclosure more comprehensible, the description of the drawings is as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Further-more, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have the usual meaning as used in the field, in the context of the invention and in the context of the particular content unless particularly specified. Some terms used to describe the invention are to be discussed below or elsewhere in the specification to provide additional guidance related to the description of the invention to specialists in the art.

The phrases "first," "second," etc., are solely used to separate the descriptions of elements or operations with the same technical terms, and are not intended to convey a meaning of order or to limit the invention.

Additionally, the phrases "comprising," "includes," "provided," and the like, are all open-ended terms, i.e., meaning including but not limited to.

Further, as used herein, "a" and "the" can generally refer to one or more unless the context particularly specifies otherwise. It will be further understood that the phrases "comprising," "includes," "provided," and the like used herein indicate the stated characterization, region, integer, step, operation, element and/or component, and does not exclude additional one or more other characterizations, regions, integers, steps, operations, elements, components and/or groups thereof.

In view of this, embodiments of the present disclosure provide an assembly structure to solve the problem of, for example, an unfixed rotational direction of a working element for lighting.

Figure 1:
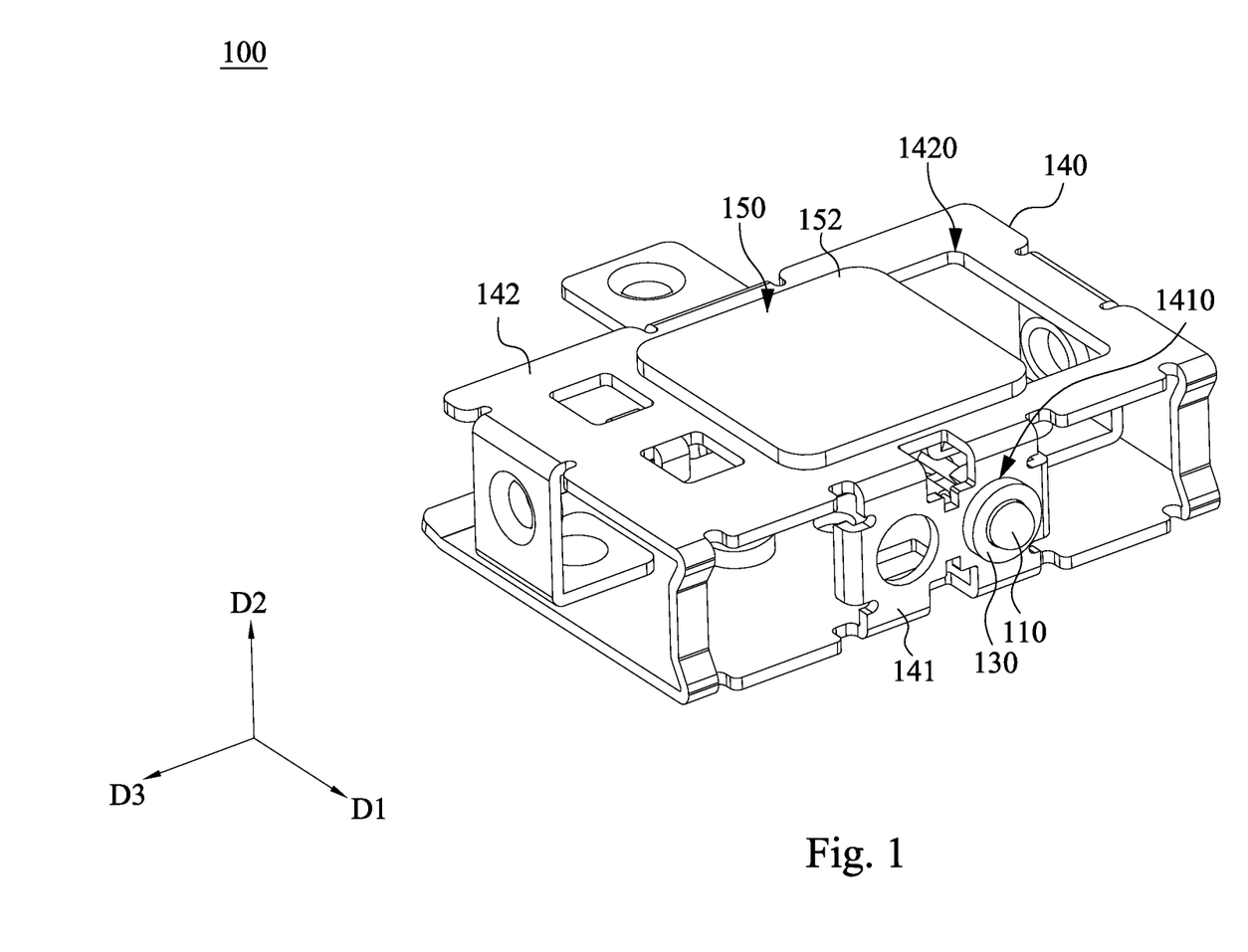
FIG. 1 illustrates a perspective view of an assembly structure according to an embodiment of the present disclosure.

Reference is made to FIG. 1. FIG. 1 illustrates a perspective view of an assembly structure 100 according to an embodiment of the present disclosure.

As shown in FIG. 1, in an embodiment of the present disclosure, the assembly structure 100 includes a light-emitting diode element 110, a positioning holder 130, a housing 140 and a limiting member 150. The light-emitting diode element 110 is a working element to be fixed in the housing 140 and is configured to emit light, but the invention is limited with respect to the type of working element to be fixed in the housing 140. In some embodiments of the present disclosure, the housing 140 is, for example, a casing of a personal computer or a casing of a server host, but it is not limited thereto. In some embodiments, when the housing 140 is the casing of a server host, the light-emitting diode element 110 may be used as an indicator light of the server host, but the present disclosure is not limited to such an embodiment. In an embodiment of the present disclosure, the server host of the present disclosure can be used for artificial intelligence (AI) computing, edge computing, a 5G server, a cloud server or a server of Internet of Vehicles.

Figure 2:
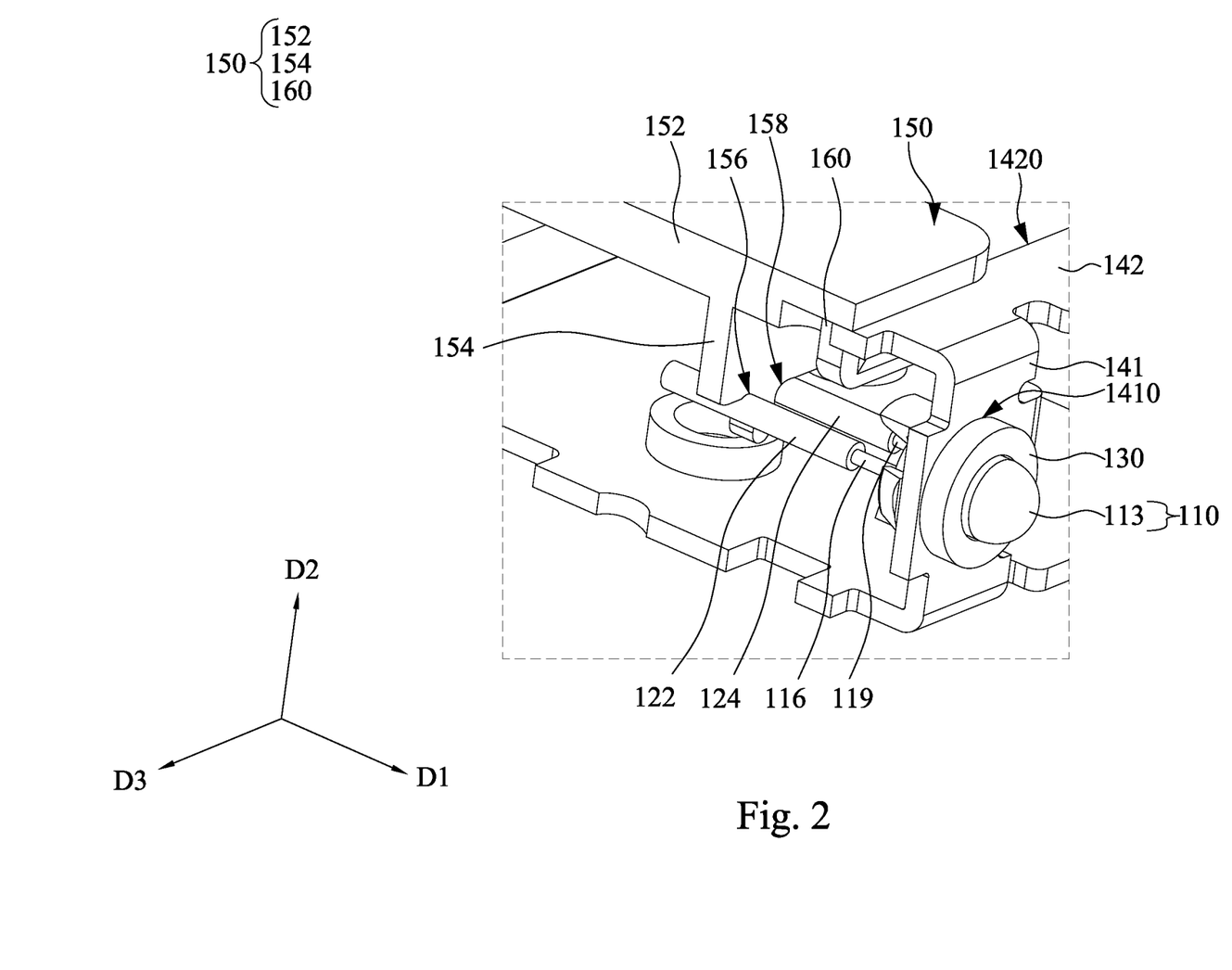
FIG. 2 is a partial cross-sectional view of FIG. 1.

Reference is made to FIG. 1 and FIG. 2. FIG. 2 is a partial cross-sectional view of FIG. 1 to further illustrate the arrangement of elements of the assembly structure 100.

As shown in FIG. 1 and FIG. 2, in this embodiment, the housing 140 includes an opening 1410 configured to accommodate the light-emitting diode element 140. In further detail, the housing 140 includes a side wall 141 and a side wall 142. The side wall 141 is parallel to a direction D2 and a direction D3. The side wall 142 is parallel to a direction D3 and the direction D1. The side wall 141 is perpendicular to the side wall 142. The opening 141 is formed in the side wall 141 and configured to accommodate the light-emitting diode element 110. A limiting member 150 is connected to the housing 140. An opening 1420 is formed in the side wall 142 of the housing 140 to accommodate the limiting member 150.

In this embodiment, the light-emitting diode element 110 is fixed in the opening 1410 through the positing holder 130. For details in this regard, reference may be made to FIG. 4 and the related discussion below. In this embodiment, since the opening 1410 is a circular shaft-hole, a certain degree of freedom is provided in the rotational direction for the light-emitting diode element 110 when the light-emitting diode element 110 and the positing holder 130 are installed. The light-emitting diode element 110 includes a light-emitting portion 113, a pin 116 and a pin 119. The light-emitting portion 113 of the light-emitting diode element 110 is configured to emit light, and the light-emitting portion 113 is exposed from the housing 140 through the opening 1410. The pins 116 and 119 of the light-emitting diode element 110 are located at a bottom of the light-emitting portion 113 and extend toward an interior of the housing 140.

In this embodiment, the assembly structure 100 further includes a cable 122 and a cable 124 covering the pin 116 and the pin 119, respectively. In FIG. 2, to simplify the description, only parts of the cable 122 and the cable 124 are shown. In some embodiments, the cable 122 and the cable 124 can be further extended to an interior of the housing 140 to be connected with other components to control the light emission of the light-emitting diode element 110.

As shown in FIG. 2, the limiting member 150 is located in the opening 1420 formed in the side wall 142 of the housing 140. The limiting member 150 includes a supporting plate 152, a convex member 154, a first abutting portion 156, a second abutting portion 158 and an abutting member 160. As shown in FIG. 1, the supporting plate 152 of the limiting member 150 has a width greater than a width of the opening 1420. Therefore, the supporting plate 152 may be arranged on the side wall 142, and the convex member 154 and the abutting member 160 protrude from the supporting plate 152 and extend inside the housing 140.

Figure 3:
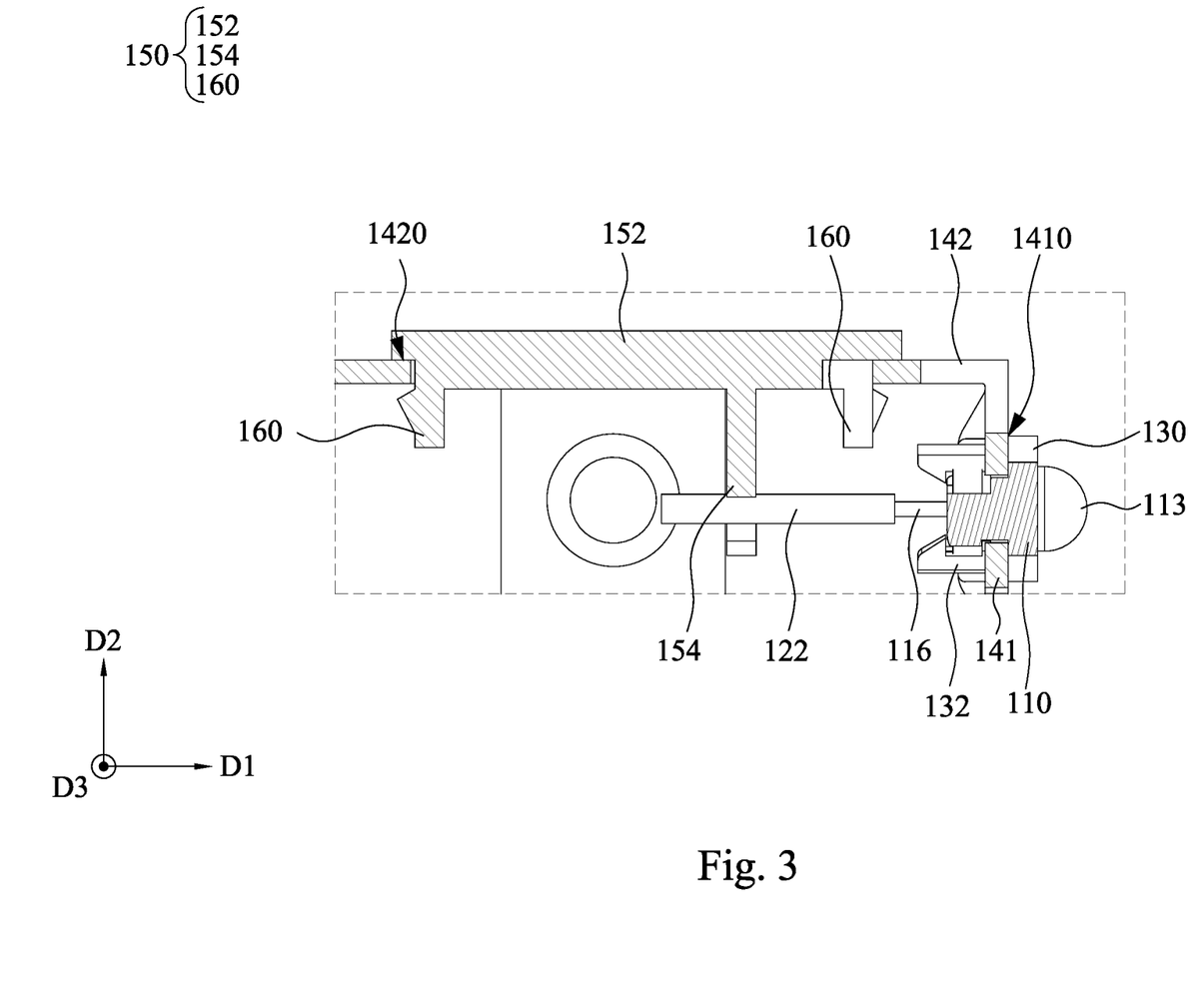
FIG. 3 is a side view of FIG. 2.

The abutting member 160 extends through the opening 1420 to abut against the side wall 142. In the partial illustration of FIG. 2, the abutting member 160 protruding from the supporting plate 152 is disposed adjacent to a part of the side wall 142 that defines the opening 1420. The supporting plate 152 is located on the side wall 142, and the abutting member 160 abuts against the part of the side wall 142 forming the opening 1420, so that the limiting member 150 can be fixed in the opening 1420. FIG. 3 is a side view of FIG. 2. The limiting member 150 includes another abutting member 160 which abuts against the part of the side wall 142 forming the opening 1420 on the other side of the opening 1420. That is, the limiting member 150 includes two abutting members 160 protruding from the supporting plate 152 and located on two opposite sides of the opening 1420, and the two abutting members 160 abut against the part of the side wall 142 forming the opening 1420 on opposite sides of the opening 1420. As a result, the limiting member 150 is fixed relative to the housing 140. As shown in FIG. 3, in this embodiment, the abutting member 160 respectively has protrusions in the direction D1, so that the limiting member 150 can be further clamped on the side wall 142 of the housing 150 for fixing on the housing 140.

Reference is made to FIG. 2 and FIG. 3. As shown in the figures, in this embodiment, the pins 116 and 119 of the light-emitting diode element 110 extend into the housing 140, and the pins 116 and 119 are connected to the wires 122 and 124, respectively. In FIG. 3, to simplify the description, only the portions of the cables 122 and 124 covered on the pins 116 and 119 are shown. The cables 122 and 124 actually have longer lengths to be connected to other components.

As shown in FIG. 2 and FIG. 3, in this embodiment, the limiting member 150 includes the convex member 154 extending to the interior of the housing 140. The convex member 154 is provided with the first abutting portion 156 and the second abutting portion 158. As shown in the figures, in this embodiment, the first abutting portion 156 and the second abutting portion 158 are L-shaped grooves. The pins 116 and 119 of the light-emitting diode element 110 and the cables 122 and 124 extend into the housing 140, and moreover, the pin 116 and the cable 122 abut against the first abutting portion 156, and the pin 119 and the cable 124 abut against the second abutting portion 158, thereby restricting the rotation of the light-emitting diode element 110.

In this embodiment, the abutting member 160 is parallel to the convex member 154, and the abutting member 160 is perpendicular to the side wall 142. As mentioned above, in this embodiment, the side wall 141 in which the opening 1410 of the light-emitting diode element 110 is located is perpendicular to the side wall 142. Therefore, once the light-emitting diode element 110 is fixed in the opening 1410, the pins 116 and 119 of the light-emitting diode element 110 extend substantially along the direction D1 and abut against the first abutting portion 156 and the second abutting portion 158, respectively. The first abutting portion 156 and the second abutting portion 158 of the limiting member 150 can limit the twisting of the pin 116 and the pin 119 in the clockwise direction or the counterclockwise direction. Accordingly, the first abutting portion 156 and the second abutting portion 158 can effectively restrict the rotation of the light-emitting diode element 110 in the circular opening 1410.

It should be noted that, in this embodiment, the light-emitting diode element 110 only includes two pins 116 and 119, but such a configuration does not limit the number of pins for the LED element or other working element of the present disclosure. In some embodiments of the present disclosure, the number of pins of the working element to be fixed in the assembly structure can be more than two, and it is only necessary to ensure that two of pins can abut against the limiting member.

In summary, when the light-emitting diode element 110 is fixed in the opening 1410 by the positioning holder 130, the light-emitting diode element 110 is twisted so that the pins 116 and 119 covered by the cables 122 and 124 respectively abut against the first abutting portion 156 and the second abutting portion 158 of the limiting member 150. The twisting/rotating direction may be in the clockwise or counterclockwise direction.

In this embodiment, the first abutting portion 156 and the second abutting portion 158 of the two L-shaped grooves form a T-shape. In some embodiments, the first abutting portion 156 and the second abutting portion 158 may be provided as separate elements.

In some embodiment, the first abutting portion 156 and the second abutting portion 158 can be used to restrict the movement of the pins 116 and 119 covered by the cable 122 and the cable 124, respectively. Specifically, in some embodiments, a wire tie is provided in which the first abutting portion 156 and the second abutting portion 158 abut against the cable 122 and the cable 124, respectively, and the wire tie clamps the cable 122 and the cable 124. In this way, the rotation of the light-emitting diode element 110 is further restricted.

Figure 4:
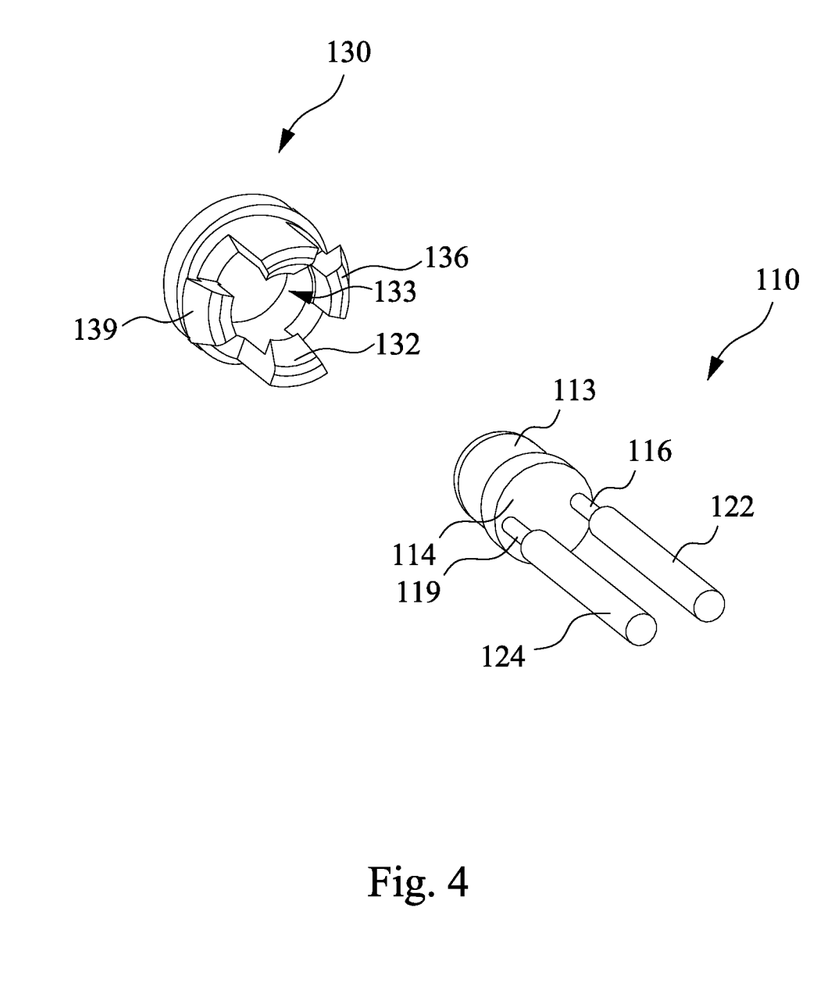
FIG. 4 illustrates an exploded view of an assembly of a positioning holder and a light-emitting diode element according to an embodiment of the present disclosure.

To further explain the overall connection arrangement of the assembly structure 100, reference is made to FIG. 4. FIG. 4 illustrates an exploded view of an assembly of the positioning holder 130 and the light-emitting diode element 110 according to an embodiment of the present disclosure.

As shown in FIG. 4, in this embodiment, the positioning holder 130 includes a fixing groove body 133. The fixing groove body 133 is configured to accommodate the light-emitting diode element 110. Two opposite sides of the fixing groove body 133 are provided with opposite engaging members 136 and 139. The engaging member 136 and the engaging member 139 extend toward the outside of the fixing groove body 133 so as to be able to be subsequently engaged with the side wall 141 in which the opening 1410 is located. More details are provided in the following discussion.

In this embodiment, the positioning holder 130 further includes a support member 132 under the fixing groove body 133. The support member 132 protrudes toward an interior of the fixing groove body 133. The support member 132 can prevent the light-emitting diode element 110 from slipping off the fixing groove body 133. Reference is made to FIGS. 3 and 4. The light-emitting diode element 110 is located inside the fixing groove body 133, and the supporting member 132 abuts against the body of the light-emitting diode element 110, so that the light-emitting diode element 110 does not slide down and moves to the interior of the housing 140.

Referring to FIG. 4, the light-emitting diode element 110 includes the light-emitting portion 113, the housing 114, and the pins 116 and 119 extending from the bottom of the light-emitting portion 113. The pin 116 and the pin 119 are respectively covered by the cable 122 and the cable 124 to increase the overall diameter of these elements so as to facilitate abutment with the first abutting portion 156 and the second abutting portion 158 of the limiting member 150.

When the light-emitting diode element 110 and the positioning holder 130 are to be assembled, the light-emitting diode element 110 enters from below the fixing groove body 133. Since the support member 132 protruding toward an interior of the fixing groove body 133 is elastic, when the light-emitting diode element 110 enters the fixing groove body 133, the support member 132 prevents the light-emitting diode element 110 from sliding down from the fixing groove body 133. Moreover, the housing 140 clamps the body of the light-emitting diode element 110, so that the light-emitting diode element 110 is firmly fixed in the positioning holder 130.

Figure 5:
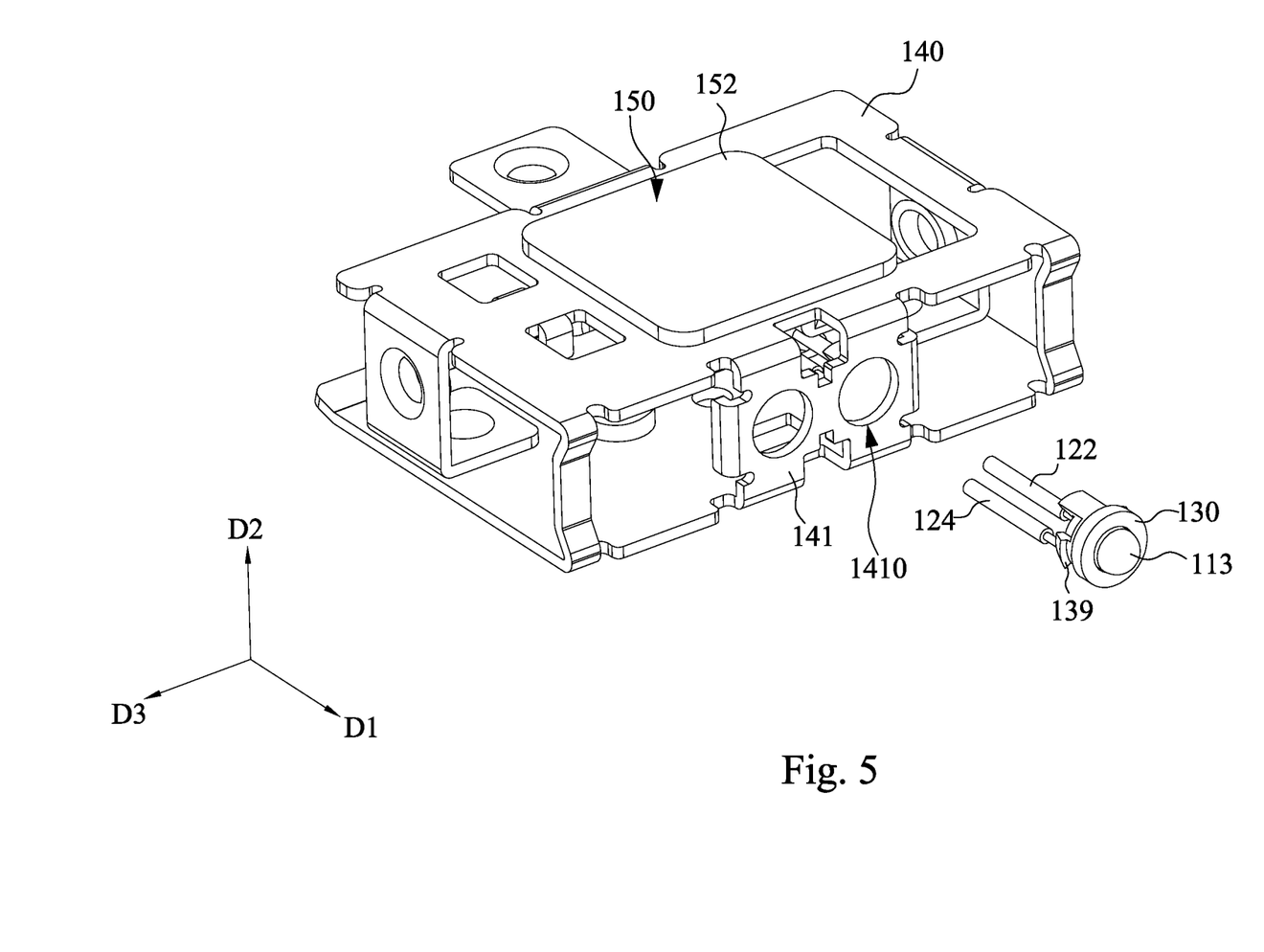
FIG. 5 illustrates a perspective view used to describe assembly of the positioning holder and the light-emitting diode element into a housing according to an embodiment of the present disclosure.

FIG. 5 illustrates a perspective view used to describe assembly of the positioning holder 130 and the light-emitting diode element 110 into the housing 140 according to an embodiment of the present disclosure. As shown in FIG. 5, after the light-emitting diode element 110 is fixed to the positioning holder 130, the positioning holder 130 can be moved in the direction D1, so that the positioning holder 130 is located in the opening 1410 of the housing 140. Since the engaging member 136 and the engaging member 139 of the positioning holder 130 are elastic, when the positioning holder 130 is located in the opening 1410, the engaging member 136 and the engaging member 139 can enter the housing 140 under force. Subsequently, when the positioning holder 130 is in place at the opening 1410, the engaging member 136 and the engaging member 139 return to their original positions, so that the positioning holder 130 is firmly fixed in the opening 1410.

After the positioning holder 130 is fixed in position, the assembly structure 100 is formed as shown in FIG. 1, and the light-emitting portion 113 of the light-emitting diode element 110 is exposed outside the housing 140. Inside the housing 140 as shown in FIGS. 2 and 3, the rotation of the light-emitting diode element 110 is restricted by the limiting member 150.

Figure 6A:
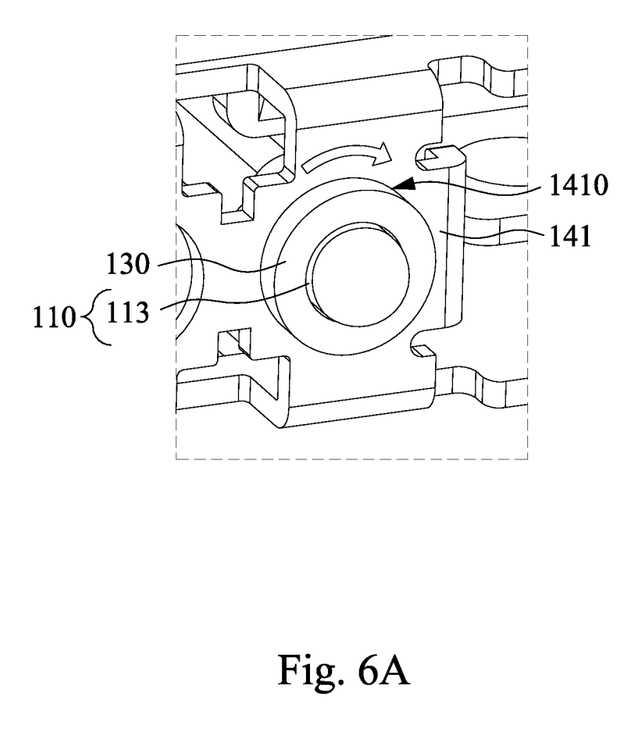
FIG. 6A illustrates a partial view of the positioning holder of FIG. 5 being engaged.
Figure 6B:
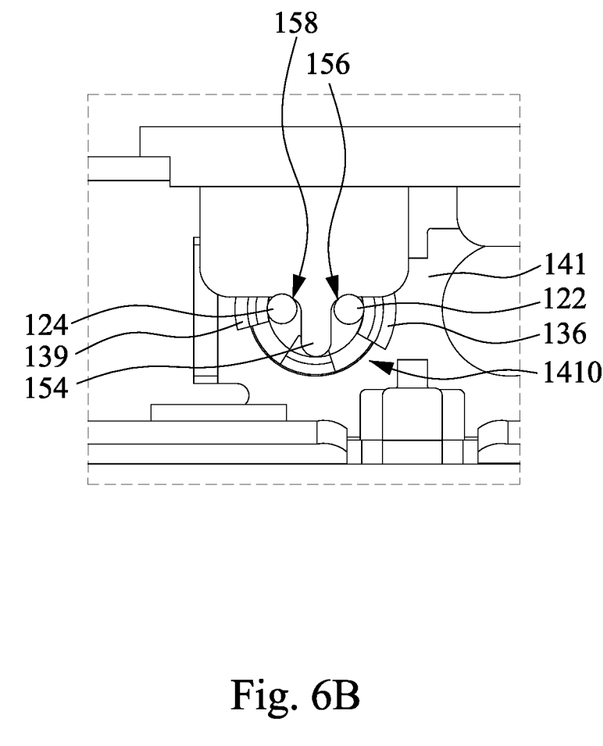
FIG. 6B illustrates a view of FIG. 6A from another angle.

FIG. 6A illustrates a partial view of the positioning holder 130 of FIG. 5 being engaged. FIG. 6B illustrates a view of FIG. 6A from another angle.

In FIG. 6A, after the positioning holder 130 is fixed to the opening 1410, the light-emitting diode element 110 and the positioning holder 130 can be rotated clockwise through the light-emitting portion 113 of the light-emitting diode element 110 to confirm that the pins 116 and 119 covered by the cables 122 and 124 respectively abut against the first abutting portion 156 and the second abutting portion 158 of the limiting member 150.

FIG. 6B illustrates FIG. 6A from an interior of the housing 140. After the rotation of the light-emitting diode element 110 in FIG. 6A, it is confirmed that the cable 122 and the cable 124 and the corresponding covered pins 116 and 119 have respectively abutted against the first abutting portion 156 and the second abutting portion 158 of the limiting member 150, respectively. Therefore, the light-emitting diode element 110 is restricted and does not easily rotate.

In FIG. 6B, the engaging member 136 and the opposite engaging member 139 are arranged along the direction D3, and the direction D3 is perpendicular to the direction D2 in which the convex member 154 of the limiting member 150 extends. In other words, the direction D3 in which the engaging member 136 is opposite to the engaging member 139 is perpendicular to the direction D2 in which the convex member 154 of the limiting member 150 extends. The engaging member 136 and the opposite engaging member 139 arranged along the direction D3 can further make the first abutting portion 156 and the second abutting portion 158 on the convex member 154 restrict the pin 116 and the pin 119, which extend along the direction D1. Therefore, the spatial displacement of the light-emitting diode element 110 can be further restricted.

In summary, the present disclosure provides an assembly structure. The rotation of the working element to be fixed to the housing can be restricted through the pins of the working element limited by a limiting member, and the degree of freedom of the working element in the rotational direction can be restricted. Therefore, if the working element is a light-emitting diode element, the problem of light appearance difference caused by rotation can be improved, and the uniformity of the brightness of the light-emitting diode element is maintained and is not affected by the assembly angle problem.

Although the present disclosure has been described in considerable detail with reference to certain embodiments thereof, other embodiments are possible. Therefore, the spirit and scope of the appended claims should not be limited to the description of the embodiments contained herein. In view of the foregoing, it is intended that the present disclosure cover modifications and variations of this invention provided they fall within the scope of the following claims.

What is claimed is:

1. An assembly structure, comprising:
   a working element comprising a first pin and a second pin;
   a positioning holder comprising a fixing groove body, wherein the working element is fixed in the fixing groove body;
   a housing comprising a first side wall and a second side wall, the first side wall is perpendicular to the second side wall, a first opening is formed in the first side wall, a second opening is formed in the second side wall, wherein the positioning holder is disposed in the first opening of the first side wall, so that the working element is disposed in the first opening, and the first and second pins extend toward an interior of the housing; and
   a limiting member connected to the housing, wherein the limiting member is disposed at a second opening of a second side wall of the housing, wherein the limiting member comprises a supporting plate and a convex member, the convex member protrude from the supporting plate and extend inside the housing through the second opening, the convex member comprises a first abutting portion and a second abutting portion, and the first pin and the second pin of the working element abut against the first abutting portion and the second abutting portion, respectively.

2. The assembly structure of claim 1, wherein the working element includes a light-emitting diode element, the light-emitting diode element comprises a light-emitting portion, the light-emitting portion is exposed from the housing, and the first and second pins are configured to extend from a bottom of the light-emitting portion toward the interior of the housing.

3. The assembly structure of claim 1, wherein the first pin and the second pin are covered by a first cable and a second cable respectively, and the first pin and the second pin abut against the first abutting portion and the second abutting portion through the first cable and the second cable, respectively.

4. The assembly structure of claim 1, wherein the positioning holder comprises a first engaging member, and the first engaging member protrudes from the fixing groove body and extends parallel to the first side wall.

5. The assembly structure of claim 4, wherein the positioning holder further comprises a second engaging member opposite to the first engaging member, the second engaging member protrudes from the fixing groove body and extends parallel to the first side wall, and a first direction in which the first engaging member is opposite to the second engaging member is perpendicular to a second direction in which the convex member of the limiting member extends.

6. The assembly structure according to claim 1, wherein the convex member is perpendicular to the supporting plate, and the first abutting portion and the second abutting portion of the convex member form a T-shape.

7. The assembly structure of claim 1, wherein the limiting member further comprises an abutting member protruding from the supporting plate, and the abutting member extends to the second opening to abut against the second side wall.

8. The assembly structure of claim 7, wherein the abutting member and the convex member are parallel to each other, and the abutting member is perpendicular to the second side wall.

* * * * *